United States Patent

[11] 3,619,217

[72] Inventor Fred William West
Skillman, N.J.
[21] Appl. No. 772,025
[22] Filed Oct. 30, 1968
[45] Patented Nov. 9, 1971
[73] Assignee FMC Corporation
New York, N.Y.
Continuation-in-part of application Ser. No. 751,363, Aug. 9, 1968, now abandoned.

[54] DESENSITIZER FOR PHOTOLITHOGRAPHIC PRINTING PLATE
2 Claims, No Drawings

[52] U.S. Cl. .......... 106/2, 101/465, 96/33
[51] Int. Cl. .......... C09d 5/20, C09k 3/00, C09k 3/18
[50] Field of Search .......... 106/2; 101/465; 96/33

[56] References Cited

UNITED STATES PATENTS

| | | | |
|---|---|---|---|
| 630,664 | 8/1899 | Cornwall | 101/465 |
| 2,037,716 | 4/1936 | Goedicke | 101/465 |
| 3,051,603 | 8/1962 | Michaels | 156/14 |

*Primary Examiner*—David Klein
*Attorneys*—Robert D. Jackson, Eugene G. Seems and Milton Zucker

ABSTRACT: A desensitizer for photolithographic printing plates based on photopolymerizable layers comprises an aqueous acidified lithographic gum in which at least part of the acid is hydrofluoric acid and a minor amount of hydrogen peroxide.

DESENSITIZER FOR PHOTOLITHOGRAPHIC PRINTING PLATE

BACKGROUND OF THE INVENTION

1. Field of the Invention

This invention relates to photolithographic printing plates. More particularly, the invention is concerned with an improved acid gum desensitizer for such plates.

2. Description of the Prior Art

The production of lithographic printing plates by photographic means is a known printing technique, being referred to in the art as photolithography. In this system of photoreproduction, a printing surface is derived by the action of light on a photosensitive layer. The first stage of the process consists of preparing a presensitized printing plate by applying a layer of photosensitive material on a base sheet, commonly a metal, such as aluminum or zinc. The presensitized plate is then subjected to a light pattern, the effect of which is to cause a hardening or resinification of the photosensitive layer in the lightstruck area. Next, the exposed plate is developed by dissolving out the unhardened portion of the photosensitive layer leaving bonded to the baseplate a hardened image corresponding to the light pattern. The plate is treated with ink which adheres to the hardened image, but not to the uncovered metal areas of the plate which are oleophobic. A gum etch is normally required to clean the nonimage metal areas and to maintain them in an ink repellent state. The aforesaid treatment is known as desensitization and the gum etch as a desensitizer. Finally, the plate is inserted in a press and printed copies run off.

The first presensitized printing plates were formulated using a bichromated colloid such as gelatin or albumin for the light-sensitive layer, which becomes insolubilized in the presence of light. Later, developments were based on light-sensitive diazos of the type which undergo a reversal of polarity on exposure to actinic radiation.

Recently, a great deal of attention has centered on photopolymer systems in which a photopolymerizable layer containing a photosensitizer and a monomer compound is exposed to actinic light, whereby the monomer undergoes polymerization in the exposed areas, which then constitute the printing surfaces. An especially effective printing plate based on photopolymerization is mentioned in U.S. Pat. No. 3,376,138 and described in greater detail in copending application Ser. No. 562,691 filed July 5, 1966, now U.S. Pat. No. 3,462,267, in which the light sensitive layer is a sensitized prepolymer of an allyl ester which undergoes cross-linking in the presence of actinic radiation, thereby forming a hardened image of remarkable toughness and durability. In fact, when utilized as a printing surface, such an image is capable of providing from 100,000 to 500,000 impressions without appreciable deterioration.

Although a decided advance in the art, printing plates based on photopolymerizable processes may be troublesome to desensitize. That is to say, it is often difficult to effect a clean removal of the nonhardened photopolymerizable coating in the unexposed areas of the plate. Apparently, even after thorough scrubbing during development, some of the unexposed layer tends to remain adsorbed to the base plate. When this occurs, it is difficult to obtain clean nonimage areas. As a consequence, the plate may produce printed copies having streaked or smudgy background areas.

Manifestly, it would be desirable to obliterate such streaking and/or spotting tendencies of lithographic printing plates derived from photopolymerizable coatings.

SUMMARY OF THE INVENTION

I have now discovered that excellent photolithographic printing plates based on photopolymerizable layers and free of streaking and spotting tendencies can be realized by using an acid gum desensitizer in which at least part of the acid is hydrofluoric acid and containing a minor amount of hydrogen peroxide.

DESCRIPTION OF THE INVENTION AND THE PREFERRED EMBODIMENTS

In carrying out the invention, a photopolymerizable element is first prepared by applying a photosensitive polymer coating onto a metallic baseplate. The element is then exposed to a light pattern to form a hardened polymerized image, the unhardened portions in the unexposed areas dissolved out and the developed plate then desensitized with the hydrofluoric acid/hydrogen peroxide desensitizer composition of the invention. The resulting plate is then placed in a press and printed copies run off. The so-obtained copies are remarkably free of background staining or smudging.

Any normally liquid to solid photopolymerizable unsaturated organic compound is applicable in the practice of the invention. Preferably, such compounds should be ethylenically unsaturated, i.e., containing at least one nonaromatic double bond between adjacent carbon atoms. Compounds particularly advantageous are the photopolymerizable vinyl or vinylidene compounds containing a $CH_2{=}C$ group activated by direct attachment to a negative group, such as halogen, $C{=}O$, $C{\equiv}N$, $CONH_2$, $C{\equiv}C$, O or aryl. The ethylenically unsaturated organic compounds, including both monomers and prepolymers with residual unsaturated linkages, may be used either alone or in admixture in order to vary the physical properties such as molecular weight, hardness, etc. of the final polymer image. Thus, it is a recognized practice in order to produce a vinyl polymer of the desired physical properties, to polymerize it in the presence of a small amount of an unsaturated compound containing at least two terminal vinyl groups, each linked to a carbon atom in a straight chain or in a ring. The function of such compounds is to cross-link the polyvinyl chain. This technique, as used in polymerization, is described by Kropa and Bradley in vol. 31, No. 12 of "Industrial and Engineering Chemistry," 1939. Typical of such cross-linking agents, for the purpose described herein, are triallyl cyanurate, divinylbenzene, divinylketone and similar polyunsaturated compounds. Generally speaking, increasing the quantity of cross-linking agents increases the hardness of the polymer obtained in the range wherein the ratio of monomer to cross-linking agent varies from 10 to 1 to 50 to 1.

The invention is particularly effective wherein the light-sensitive polymerizable material is a partially polymerized monomer still containing residual centers of unsaturation. A remarkably effective class of materials, in this respect, are the cross-linkable allyl resins obtained by the addition polymerization of an addition polymerizable allyl carboxylic ester having a plurality of aliphatic ethylenically unsaturated linkages, preferably two to four, at least one of which is an allyl ester group. Polymerization is carried out under such condition, given elsewhere herein in greater detail, that at least one of the ethylenically unsaturated linkages, preferably one of the allyl ester groups attached to the monomer, remains intact and unreacted. This results in a polymeric system consisting of a chain of $>C{-}C<$ units each of which bears an aliphatic ethylenically unsaturated group, preferably an allyl ester. It is these residual centers of unsaturation which enable such resins to undergo photopolymerization when formulated and used in accordance with the invention.

The polymerization of allyl ester monomers in the aforedescribed manner is a known technique and is based on the more rapid polymerization between allyl monomers than cross-linking of the allyl ester groups or other unsaturated groups in the resin polymer. It is this differential in reactivity which makes it possible to prepare and isolate the noncross-linked allylic resin. The latter type of resins are solvent-soluble solids at ambient temperatures and contain at most very small percentages of the parent monomers so that very little shrinkage occurs on being cross-linked or photopolymerized by actinic radiation. The afore-enumerated physical properties are among those which make noncross-linked allylic resins excellent materials for producing the herein presensitized printing plates.

The cross-linkable allyl ester resins used in practicing the invention fall generally into the following classes: methacrylate, a. Prepolymers derived from allyl esters of unsaturated monobasic acids having either the general formula $C_nH_{2n11}$ COOR or $C_nH_{2n111y}X_yCOOR$, such as allyl acrylate, allyl chloroacrylate, allyl methacrylate, allyl crotonate, allyl cinnamate, allyl cinnamalacetate, allyl furoate, allyl furfurylacrylate. It is to be understood that in all formulas used herein, R is an allyl group, $n$ can be any integer from 1 to 17 inclusive, except where the acid is unsaturated in which case $n$ is 2 to 17, $y$ is 1 or 2, and X is a halogen, hydroxyl, phenyl, substituted phenyl, or furfuryl group or an alkyl or alkoxy group having 1–4 carbon atoms.

b. Precopolymers of allyl esters of unsaturated monobasic acids, such as allyl methacrylate with butadiene, allyl methacrylate with methyl methacrylate, allyl methacrylate with styrene, allyl methacrylate with vinylidene chloride, allyl crotonate, with methyl methacrylate, allyl crotonate with styrene, allyl crotonate with vinyl chloride, allyl crotonate with vinyl acetate, allyl crotonate with vinylidene chloride, allyl crotonate with diethyleneglycol maleate, allyl cinnamate with vinylidene chloride, allyl cinnamate with styrene, allyl cinnamate with cinnamyl cinnamate, allyl furoate with styrene, and allyl furoate with vinylidene chloride.

c. Prepolymers derived from allyl esters of aliphatic carboxylic acids having two or more allyl groups and having one of the following general formulas: $C_nH_{2n}(COOR)_2$, $C_nH_{2n11}$ $(COOR)_3$, $C_nH_{2n}{}^{1}{}_{y}X_y(COOR)_2$, $C_nH_{2n111y}X_y(COOR)$, $C_nH_{2n12}$ $(COOR)_2$, $C_nH_{2n12y}X_y(COOR)_2$, or ROOCOR, such as diallyl oxalate, diallyl malonate, diallyl succinate, diallyl sebacate, diallyl maleate, diallyl fumerate, diallyl itaconate, diallyl tartrate, diallyl carbonate, diallyl adipate, triallyl citrate, triallyl carballylate, diallyl malate, and diallyl citraconate.

d. Precopolymers of allyl esters of aliphatic carboxylic acids having two or more allyl groups; such as diallyl oxalate with vinylidene chloride, diallyl oxalate with styrene, diallyl malonate with vinylidene chloride, diallyl succinate with vinylacetate, diallyl succinate with vinylidene chloride, diallyl succinate with polyvinyl acetate, diallyl adipate with vinylidene chloride, diallyl sebacate with vinylidene chloride, diallyl maleate with methyl methacrylate, diallyl maleate with styrene, diallyl maleate with vinylidene chloride, and diallyl carbonate with methyl methacrylate.

In the aromatic series are those cross-linkable copolymer resins derived from an allyl ester in which the acid is normally of the benzene-naphthalene series and cyanuric acid, typical monomers being diallyl isophthalate, diallyl terephthalate, diallyl orthophthalate, triallyl mellitate, tetraallyl pyromellitate, triallyl cyanurate and the like.

In the manufacture of cross-linkable allyl resins, also known as prepolymers, the monomeric materials are polymerized in conventional fashion to produce a solution of a soluble polymer in the monomer to the point short of gelation which occurs when cross-linking of the polymer approaches that point where it becomes insoluble in the monomer. These polymer solutions, or dopes, are then separated into a solvent-soluble prepolymer fraction and a monomer fraction. This is effected by treatment with a solvent which dissolves the monomer while precipitating the polymerized portion or by other means which will leave a soluble prepolymer substantially free of monomer. A typical method for separating such cross-linkable prepolymers is described in U.S. Pat. No. 3,030,341.

Another important light-sensitive polymerizable system with which the sensitizer composition of the invention is effective are the polyesters of alpha-beta ethylenic, alpha-beta dicarboxylic acids and ethylenically unsaturated compounds copolymerized therewith of the type described in U.S. Pat. No. 2,673,151 to Gerhart.

Another class of light-sensitive photopolymer systems compatible with the desensitizer compositions herein are polyvinylaraphenones of the type disclosed in U.S. Pat. No. 2,831,768, and cinnamic acid derivatives, particularly polyvinyl cinnamate. Such light-sensitive cinnamic acid derivatives are well known in the photolithographic art, and in this connection reference is made to "Light Sensitive Systems" by Jaromer Kosar, 1965, published by John Wiley and Sons, Inc.

In order to obtain coatings which photopolymerize with sufficient speed to be commercially useful, it is usually necessary to add to the polymer a sensitizing agent, which absorbs actinic radiation, so as to dissociate into free radicals which accelerate complete polymerization of the polymerizable compound, whether it be a monomer or partial or prepolymer, or mixtures of these entities. The sensitizing agent can be ethers of benzoin, such as methyl ether of benzoin; benzophenone, p,p'-substituted benzophenones such as 4,4'-bis(dimethylamino)benzophenone and 4,4'-bis(diethylamino)benzophenone; or bis(1-anthraquinonyl amino) anthraquinones such as 1,4-bis(1-anthraquinonyl amino) anthraquinone and 1,5-bis(1-anthraquinonyl amino) anthraquinone, and combinations thereof. Other useful sensitizing agents include polynuclear quinones such as xanthone, 1,2-benzananthraquinone and 2-methyl anthraquinone; mononuclear quinones such as 2,5-diphenyl-p-quinone; aromatic $\alpha$-diketones such as benzil; substituted aryl methylene dioxy compounds such as piperonal, piperoin, 3,4-methylene dioxychalcone, and 5,6-methylene dioxyhydrindone-1; substituted $\beta$-naphthoselenazolines such as 1-methyl-2-acetyl methylene-$\beta$-naphthoselenazoline; substituted $\beta$-benzothiazolines such as 3-methyl-2benzoyl methylene benzothiazoline; substituted $\beta$-naphthothiazolines such as 1-methyl-2-benzoyl methylene-$\beta$-naphthothiazoline; anthrones such as anthrone; benzanthrones such as benz-2-ethyl-benzanthrone and 7-H-benz(de)-anthracen-7-one; and azabenzanthrones such as 2-keto-3-methyl-1,3-diazabenzanthrone.

The concentration of sensitizer in the photopolymerizable composition depends upon the inherent sensitivity of the cross-linkable allyl ester resin present. In a typical case where the resin is the prepolymer of diallyl isophthalate, from about 1 to 20 percent, preferably 1.5 percent by weight of prepolymer, of 1,4-bis(1-anthraquinonyl amino) anthraquinone is recommended. Some sensitizers, such as p,p'-substituted benzophenones, e.g. 4,4'-bis-(dimethyl amino) benzophenone, in an amount less than 1.5 percent cause a considerable increase in sensitivity to actinic light. The sensitizer is excited by the actinic radiation, and, in turn, initiates the polymerization. The mechanism of the reaction is believed to be that the sensitizer dissociates into free radicals due to actinic radiation or energy that it absorbs, and the resulting free radicals initiate cross-linking of the prepolymer to render it insoluble.

The addition of the sensitizer to the polymerizable material increases its response to actinic rays by a factor of 100 to 200 times. On exposure, the film coating polymerized sufficiently rapidly whereby it can be used in conventional platemaking procedures.

The baseplate metals used herein are ink repellent or oleophobic since such metal provides the nonprinting surfaces in the finally produced printing plate. The most commonly used base metals are aluminum, zinc or stainless steel.

The presensitized plates aforesaid are converted into lithographic printing plates by exposure to a light pattern whereby the photocurable or cross-linkable polymeric compound is further polymerized or cured in the exposed areas. The plate is then developed by washing out the noncured or unpolymerized compound corresponding to the unexposed portion of the plate, thereby uncovering the oleophobic metallic base layer.

The liquid used to remove or dissolve out the non-polymerized coating in the e exposed areas of the photographic element are advantageously relatively high boiling organic solvents of the type commonly employed in most lithographic shops. One preferred solvent is tetrahydrofurfurylphosphate although excellent solvents include aromatic hydrocarbons and their chlorinated derivatives such as toluene, xylene, chlorinated xylene, chlorinated toluene, chlorinated aliphatic hydrocarbons, e.g. trichloroethylene, trichloroethane and the like, higher boiling ketones glycol monoethers, such as ethylene glycol monoethyl ether, diethyleneglycol monoethyl ether and the carboxylic esters of such glycol monoethers. Such solvents can be used alone or in admixture or as emulsions in water. The solvents are commonly applied in combination with a scrubbing action.

At this point the plate is desensitized in the usual manner, but using the new desensitizer of the invention, inserted in a printing press and copies run off. The copies so obtained are remarkably clean, exhibiting a marked absence of scum or tone in the background areas. This could not be accomplished when the usual acid gum desensitizer was used.

The desensitizer compositions herein are prepared by dissolving a hydrophilic colloid, of the type commonly used to prepare gum desensitizers, in a dilute aqueous acid solution in which at least part of the acid is provided by hydrofluoric acid and a minor amount of hydrogen peroxide. So far as I have been able to ascertain, the presence of the hydrofluoric acid is necessary to effect removal of all the unhardened prepolymer in the exposed areas and thereby provide clean background areas free of streaks and smudges. Other acids normally used in preparing desensitizer gum solutions, such as phosphoric acid, are not capable of removing all of the nonhardened prepolymer.

The hydrogen peroxide can be formed in situ, or added directly to the sensitizer formulation. In some instances it may be desirable to use hydrogen peroxide stabilizers in order to prolong the storage stability of the desensitizer composition or to prevent their decomposition while in use. Such stabilization of hydrogen peroxide is well known in the art.

The presence of the hydrogen peroxide, as far as I can determine, is necessary to prevent excessive foaming which occurs when the hydrofluoric acid is applied.

They hydrogen fluoride can serve as the sole acid component or it can be used in combination with phosphoric acid, or other acids known to the trade.

Although the amounts of ingredients in the desensitizer composition of the invention are not particularly critical, we have found that the numerical ratios for the various components on a volume basis can vary from about 0.3 percent to 6 percent of 30 percent hydrogen peroxide; 0.1 percent to 2 percent of 50 percent hydrofluoric acid; 3 percent to 12 percent of 85 percent phosphoric acid; 50 percent to 90 percent of a 28 percent hydrophillic gum and 0 to 10 percent water. Normally the amount of hydrogen peroxide will be that required to prevent foaming, whereas the amount of hydrofluoric acid is that which will effectively remove all of the unhardened prepolymer in the nonprinting areas of the plate. The strengths of the ingredients are expressed on a weight basis.

Reference is made to the following examples:

PREPARATION OF PRESENSITIZED PLATE

A typical formulation for photosensitized coating solution used for making printing plates is prepared as follows:

12 g. diallylisophthalate prepolymer (Dapon M)
55 g. xylene
33 g. Pentoxone (4-methoxy-4-methyl-penatonone-2)
0.1 g. benzil
0.1 g. Michler's ketone
0.4 g. xanthone The prepolymer is dissolved in the xylene and the solution refined to remove insoluble fractions by filtration or centrifuging. The photosensitizers, benzil, Michler's ketone, and xanthone, are dissolved in the Pentoxone and thoroughly mixed with the polymer solution. The coating solution is then ready for use.

This solution is applied to an aluminum sheet by whirl coating technique to produce a uniform coating 0.1 mil thick. After evaporation of some of the solvent, the plate is heated to 125° F. for 5 minutes to remove most of the residual solvent. After cooling, the photosensitive coating is seen as a colorless, dry film on the metal surface.

The coated plate is handled under reduced intensity illumination conventionally used in platemaking shops.

The plate is covered with a negative mask or film transparency and exposed through the mask to a carbon arc, mercury vapor, or other source of ultraviolet light. After exposure, the plate is developed to remove the unhardened polymer by covering the plate with xylene, 1,1,1-trichloroethane, methyl ethyl ketone, trichloroethylene or mixture of similar solvents. A contact time of about one minute is allowed before the developing solvent is flushed away with water. The image, composed of the light-hardened resin, is visible at this point.

After rinsing, and the surplus water removed, the plate is treated with the new acid gum desensitizer of the invention. The desensitizer is applied in the usual manner which consists of flowing the desensitizer onto the plate, using an applicator pad to effect even distribution over the surface of the plate; time of treatment is about 1 to 1½ minutes.

The results of processing exposed allyl ester prepolymer coatings with various formulations of the desensitizers of the invention together with typical gum etches normally used in the trade are summarized in the following table:

DESENSITIZING SOLUTIONS AND EFFECT ON PLATE PROCESSING

| | Composition in percent by volume | | | | | | | |
|---|---|---|---|---|---|---|---|---|
| Example | 1 | 2 | 3 | 4 | 5 | 6 | 7 | 8 |
| 14° Bé gum arabic | 97 | 55 | 54 | 80 | 80 | 85 | 54 | 95 |
| Phosphoric acid, 85% | 3 | | | 12 | 12 | 15 | 3 | |
| Hydrofluoric acid, 50% | | 1 | 1 | .2 | .4 | | | |
| Hydrogen peroxide, 30% | | | 1.5 | .5 | 1.0 | | | |
| Water | | 44 | 43.5 | 7.3 | 7.0 | | 43 | 5 |
| | Scums | (1) | (2) | (2) | (2) | Scums | Scums | Scums |

[1] Clean plate; foams badly, streaky, requires extreme care.
[2] Clean plate; no foam, no streaks.

As is evident from examining the data of the table, it is necessary that the desensitizer composition contain at least some hydrofluoric acid in order to achieve a clean scum-free plate. It is also clear from the table that in order to achieve both a scum-clean plate without excessive foaming, it is necessary that the desensitizing composition contain sufficient hydrogen peroxide, normally a minor amount, to control such foaming. Example 4 is the preferred formulation.

EXAMPLE 9

The procedure of the previous example was repeated but substituting polyvinyl cinnamate for the diallyl isophthalate prepolymer. Generally speaking, the results paralleled those obtained with the previous examples.

Polyvinyl cinnamate is a well-known commercial resin and was purchased on the chemical market as KPR, a product of Eastman Kodak Company, Rochester, N.Y.

What is claimed is:

1. A desensitizer composition for desensitizing presensitized printing plates in which the light sensitive element is a photopolymerizable layer comprising approximately by volume 0.3 percent to 6 percent of 30 percent hydrogen peroxide; 0.1 percent to 2 percent of 50 percent hydrofluoric acid; 3 percent to 12 percent of 85 percent phosphoric acid; 50 percent to 90 percent of a 28 percent hydrophilic gum and 0 to 10 percent water.

2. A desensitizer composition for desensitizing presensitized printing plates in which the light sensitive element is a photopolymer comprising by volume about 80 percent of 14° B. gum arabic; about 0.2 percent of 50 percent hydrofluoric acid; about 12 percent of 85 percent phosphoric acid; about 0.5 percent of 30 percent hydrogen peroxide and about 7.3 percent water.

* * * * *

UNITED STATES PATENT OFFICE
CERTIFICATE OF CORRECTION

Patent No. 3,619,217 Dated November 9, 1971

Inventor(s) Fred William West

It is certified that error appears in the above-identified patent and that said Letters Patent are hereby corrected as shown below:

Column 3, line 2, "methacrylic" should be omitted.

Column 3, line 4, "$C_nH_{2n11}$" should read --$C_nH_{2n-1}$--.

Column 3, line 6, "$C_nH_{2n111y}X_yCOOR$" should read --$C_nH_{2n-1-y}X_yCOOR$--.

Column 3, line 28, "$C_nH_{2n11}(COOR)_3$" should read --$C_nH_{2n-1}(COOR)_3$--.

Column 3, line 29, "$C_nH_{2n\ 1\ y}X_y(COOR)_2$" should read --$C_nH_{2n-y}X_y(COOR)_2$--.

Column 3, line 29, "$C_nH_{2n111y}X_y(COOR)$" should read --$C_nH_{2n-1-y}X_y(COOR)$--.

Column 3, lines 29-30, "$C_nH_{2n12}(COOR)_2$" should read --$C_nH_{2n-2}(COOR)_2$--.

Column 3, line 30, "$C_nH_{2n12y}X_y(COOR)_2$" should read --$C_nH_{2n-2y}X_y(COOR)_2$--.

PO-1050 (10-69)

USCOMM-DC 60376-P69
☆ U.S. GOVERNMENT PRINTING OFFICE : 1969 O—366-334

UNITED STATES PATENT OFFICE
CERTIFICATE OF CORRECTION

Patent No. 3,619,217 Dated November 9, 1971

Inventor(s) Fred William West

It is certified that error appears in the above-identified patent and that said Letters Patent are hereby corrected as shown below:

Column 3, line 2, "methacrylic" should be omitted.

Column 3, line 4, "$C_nH_{2n11}$" should read --$C_nH_{2n-1}$--.

Column 3, line 6, "$C_nH_{2n111y}X_yCOOR$" should read --$C_nH_{2n-1-y}X_yCOOR$--.

Column 3, line 28, "$C_nH_{2n11}(COOR)_3$" should read --$C_nH_{2n-1}(COOR)_3$--.

Column 3, line 29, "$C_nH_{2n\ ^1\ y}X_y(COOR)_2$" should read --$C_nH_{2n-y}X_y(COOR)_2$--.

Column 3, line 29, "$C_nH_{2n111y}X_y(COOR)$" should read --$C_nH_{2n-1-y}X_y(COOR)$--.

Column 3, lines 29-30, "$C_nH_{2n12}(COOR)_2$" should read --$C_nH_{2n-2}(COOR)_2$--.

Column 3, line 30, "$C_nH_{2n12y}X_y(COOR)_2$" should read --$C_nH_{2n-2y}X_y(COOR)_2$--.

UNITED STATES PATENT OFFICE

CERTIFICATE OF CORRECTION

Patent No. 3,619,217 Dated November 9, 1971

Inventor(s) Fred William West

It is certified that error appears in the above-identified patent and that said Letters Patent are hereby corrected as shown below:

Column 4, line 28, "3-methyl-2benzoyl" should read --3-methyl-2-benzoyl--.

Column 7, line 5, "B." should read --Bé--.

Signed and sealed this 19th day of December 1972.

SEAL)
ttest:

DWARD M.FLETCHER,JR.
ttesting Officer

ROBERT GOTTSCHALK
Commissioner of Patent